(12) United States Patent
Zitzlsperger et al.

(10) Patent No.: US 9,219,210 B2
(45) Date of Patent: Dec. 22, 2015

(54) METHOD FOR PRODUCING OPTOELECTRONIC SEMICONDUCTOR COMPONENTS, LEADFRAME ASSEMBLAGE AND OPTOELECTRONIC SEMICONDUCTOR COMPONENT

(71) Applicant: OSRAM Opto Semiconductors GmbH, Regensburg (DE)

(72) Inventors: Michael Zitzlsperger, Regensburg (DE); Jürgen Holz, Wenzenbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/363,738

(22) PCT Filed: Dec. 13, 2012

(86) PCT No.: PCT/EP2012/075431
§ 371 (c)(1),
(2) Date: Jun. 6, 2014

(87) PCT Pub. No.: WO2013/092387
PCT Pub. Date: Jun. 27, 2013

(65) Prior Publication Data
US 2014/0353710 A1 Dec. 4, 2014

(30) Foreign Application Priority Data
Dec. 20, 2011 (DE) .......... 10 2011 056 700

(51) Int. Cl.
*H01L 21/66* (2006.01)
*H01L 33/62* (2010.01)
(Continued)

(52) U.S. Cl.
CPC ............. *H01L 33/62* (2013.01); *H01L 22/14* (2013.01); *H01L 24/97* (2013.01); *H01L 25/13* (2013.01);
(Continued)

(58) Field of Classification Search
CPC ........ H01L 22/00–22/34; H01L 33/00–33/648
See application file for complete search history.

(56) References Cited

U.S. PATENT DOCUMENTS 6,489,218 B1 * 12/2002 Kim et al. ............... 438/460
8,049,237 B2 * 11/2011 Yamada et al. ........... 257/98
(Continued)

FOREIGN PATENT DOCUMENTS

EP 2161765 A2 3/2010
EP 2515354 A1 10/2012
(Continued)

OTHER PUBLICATIONS

Lai, Y., et al., "Development and Performance Characterization of a QFN/HMT Package," IEEE Electronics Components and Technology Conference, May 27-30, 2008, pp. 964-967.

*Primary Examiner* — Matthew Landau
*Assistant Examiner* — Eric Ward
(74) *Attorney, Agent, or Firm* — Slater & Matsil, L.L.P.

(57) ABSTRACT

A method serves to produce optoelectronic semiconductor components. A leadframe assemblage includes a number of leadframes. The leadframes each comprise at least two leadframe parts and are connected together at least in part via connecting webs. Electrical connections are attached between neighboring leadframes. A potting body connects the leadframes and the leadframe parts mechanically together. At least some of the connecting webs are removed and/or interrupted, the resulting structure is singulated into the semiconductor components.

16 Claims, 9 Drawing Sheets

(51) Int. Cl.
  *H01L 31/0203* (2014.01)
  *H01L 23/00* (2006.01)
  *H01L 25/13* (2006.01)
  *H01L 33/52* (2010.01)
  *G01R 31/26* (2014.01)
  *H01L 33/00* (2010.01)
  *H01L 33/48* (2010.01)
  *H01L 23/495* (2006.01)

(52) U.S. Cl.
  CPC ............ *H01L 31/0203* (2013.01); *H01L 33/52* (2013.01); *G01R 31/2635* (2013.01); *H01L 22/32* (2013.01); *H01L 23/49541* (2013.01); *H01L 23/49562* (2013.01); *H01L 33/0095* (2013.01); *H01L 33/486* (2013.01); *H01L 2224/16245* (2013.01); *H01L 2224/45144* (2013.01); *H01L 2224/48247* (2013.01); *H01L 2224/48471* (2013.01); *H01L 2924/12041* (2013.01); *H01L 2924/19107* (2013.01); *H01L 2933/005* (2013.01); *H01L 2933/0033* (2013.01); *H01L 2933/0066* (2013.01)

(56) References Cited

U.S. PATENT DOCUMENTS

| | | | |
|---|---|---|---|
| 8,076,181 B1 * | 12/2011 | Pruitt et al. | 438/111 |
| 8,377,725 B2 | 2/2013 | Fujitomo et al. | |
| 2004/0000727 A1 | 1/2004 | Hsu | |
| 2006/0055012 A1 | 3/2006 | Hsin Chen et al. | |
| 2006/0249746 A1 | 11/2006 | Oshio | |
| 2007/0262328 A1 | 11/2007 | Bando | |
| 2008/0224161 A1 | 9/2008 | Takada | |
| 2008/0253064 A1 | 10/2008 | Wu | |
| 2010/0213484 A1 | 8/2010 | Lin | |
| 2011/0024786 A1 * | 2/2011 | Sugiyama | 257/99 |
| 2012/0241922 A1 * | 9/2012 | Pagaila | 257/659 |
| 2012/0292660 A1 | 11/2012 | Kanno | |

FOREIGN PATENT DOCUMENTS

| | | |
|---|---|---|
| JP | 2002314138 A | 10/2002 |
| JP | 2008282932 A | 11/2008 |
| JP | 2010147189 A | 7/2010 |
| WO | 2011093174 A1 | 8/2011 |

* cited by examiner

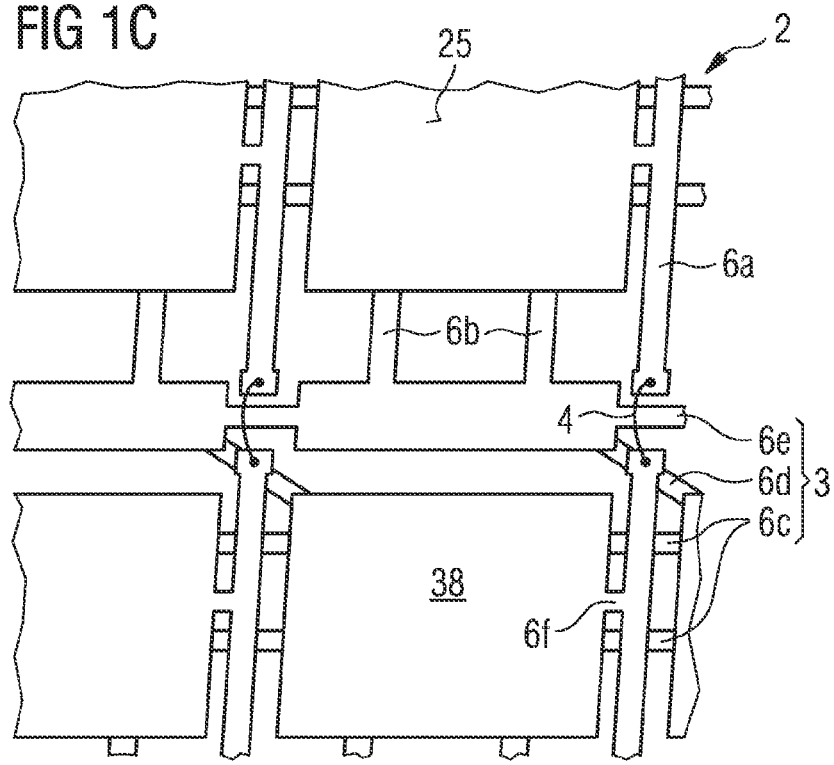
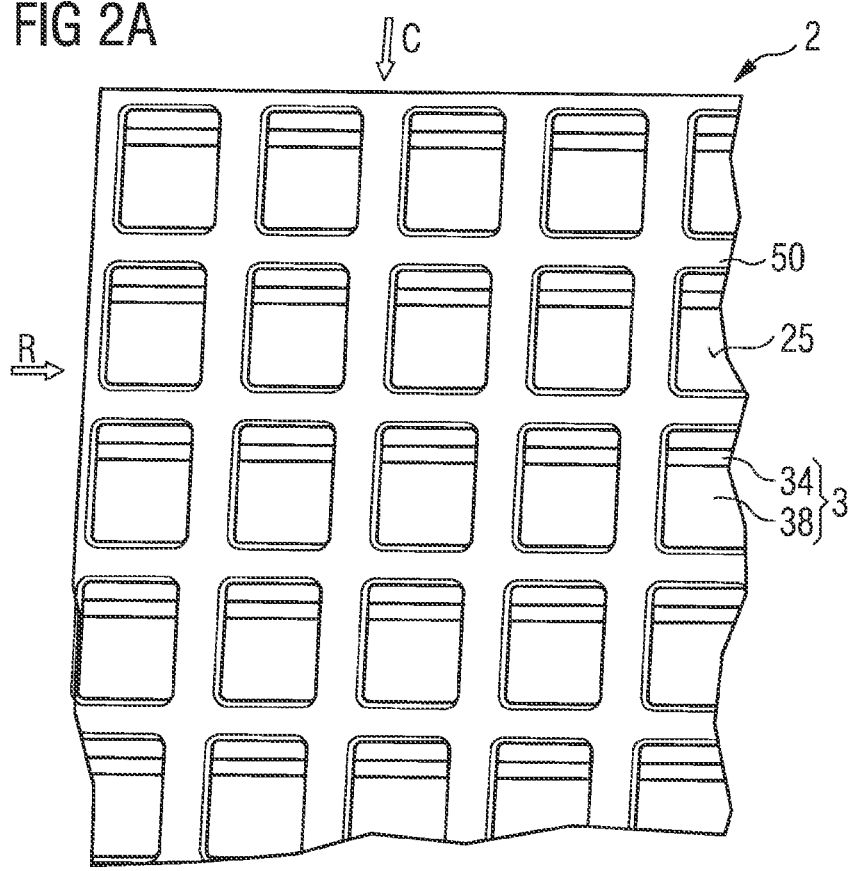

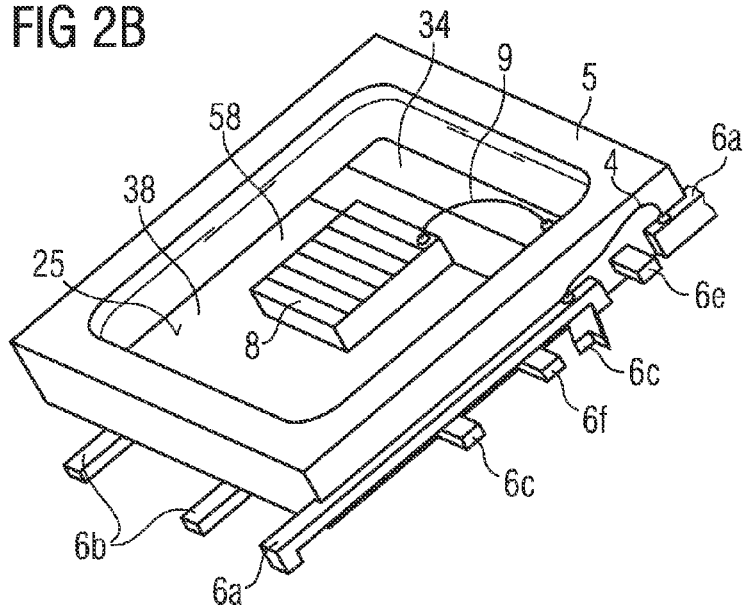
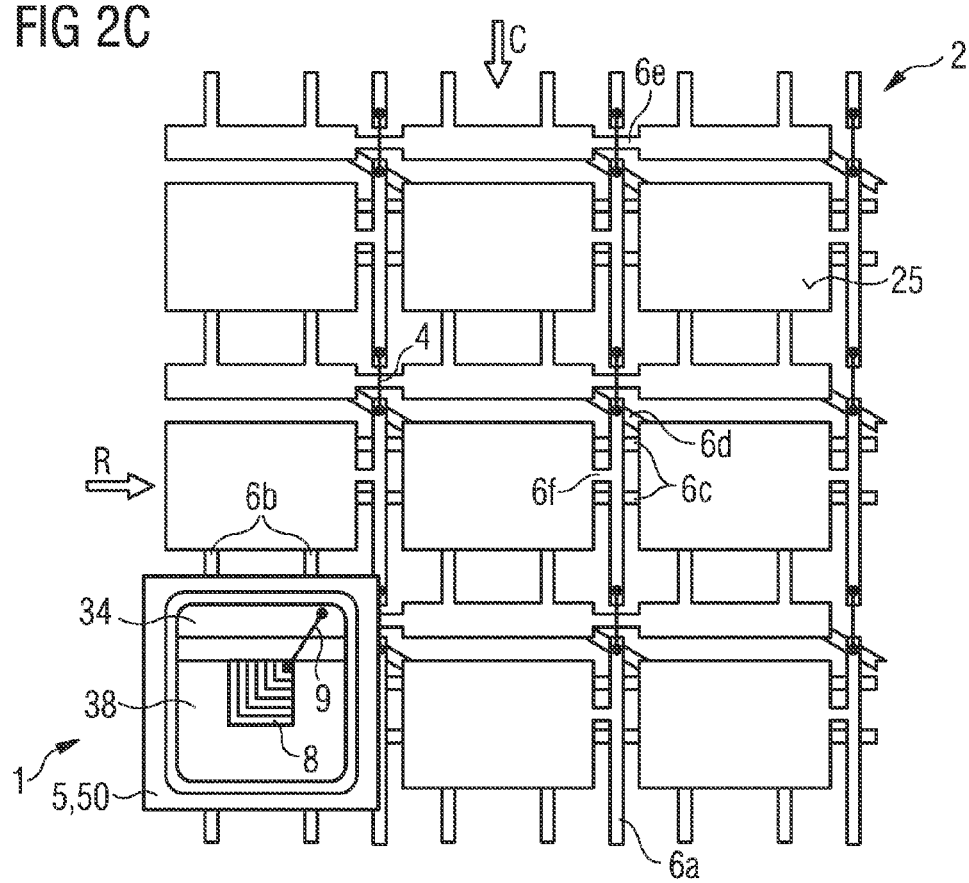

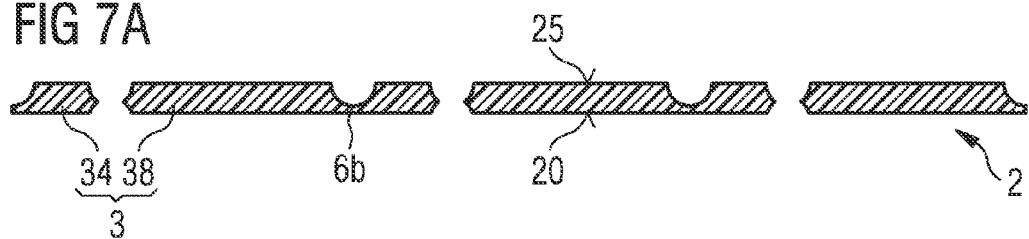
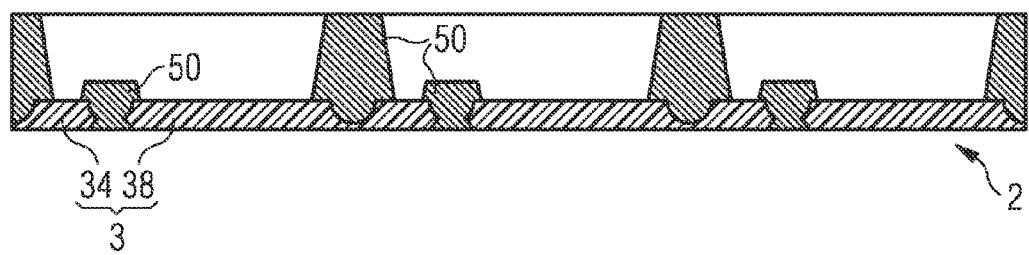
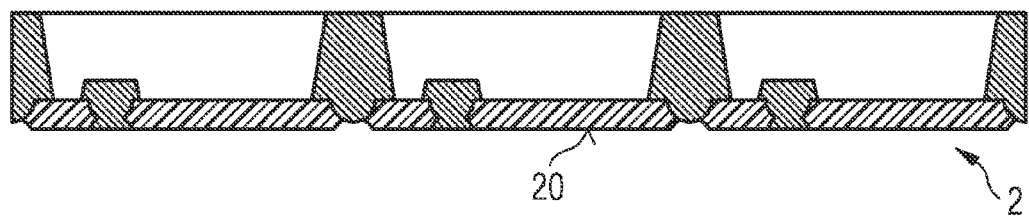
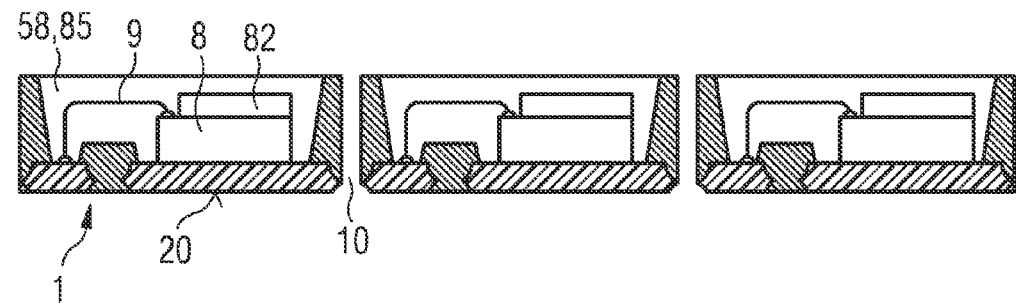

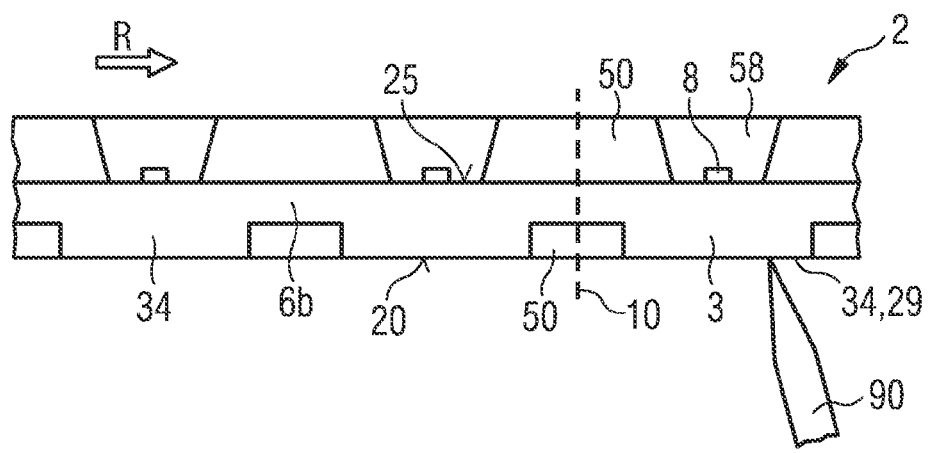
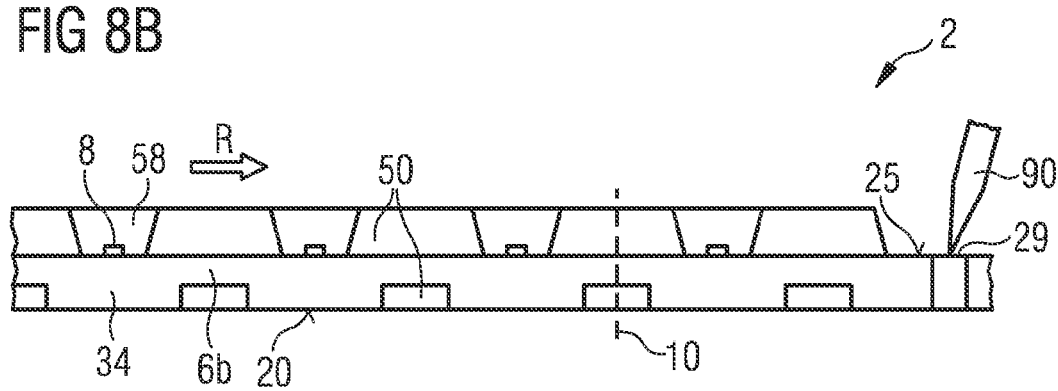

METHOD FOR PRODUCING OPTOELECTRONIC SEMICONDUCTOR COMPONENTS, LEADFRAME ASSEMBLAGE AND OPTOELECTRONIC SEMICONDUCTOR COMPONENT

This patent application is a national phase filing under section 371 of PCT/EP2012/075431, filed Dec. 13, 2012, which claims the priority of German patent application 10 2011 056 700.3, filed Dec. 20, 2011, each of which is incorporated herein by reference in its entirety.

TECHNICAL FIELD

A method is provided for producing an optoelectronic semiconductor component. Also provided are a leadframe assemblage and an optoelectronic semiconductor component.

SUMMARY OF THE INVENTION

A method for producing optoelectronic semiconductor components can achieve a high yield.

According to at least one embodiment of the method, the method includes the step of providing a leadframe assemblage. The leadframe assemblage comprises a plurality of leadframes. Preferably, each of the leadframes of the leadframe assemblage is intended for one of the semiconductor components to be produced.

According to at least one embodiment, the leadframe assemblage is a one-piece workpiece. All the leadframes and further components of the leadframe assemblage are then joined together in one piece. For example, the individual leadframes and further components of the leadframe assemblage are formed by stamping or cutting from a metallic sheet.

According to at least one embodiment of the method, each of the leadframes comprises at least two or precisely two or at least three or precisely three leadframe parts. The optoelectronic semiconductor component, for which the corresponding leadframe is intended, can be electrically contacted and interconnected via the individual leadframe parts of the leadframe.

According to at least one embodiment, the leadframes and/or the leadframe parts are connected together electrically and at least temporarily mechanically at least in part via connecting webs of the leadframe assemblage. The connecting webs are preferably made from the same material as the leadframes and the leadframe parts. The connecting webs are in particular made in one piece with the leadframes and leadframe parts from the same metal sheet. In the finished semiconductor component the connecting webs preferably no longer have any electrical or mechanical function.

According to at least one embodiment, the method comprises the step of attaching additional electrical connections (i.e., connecting means) between neighboring leadframes and/or between neighboring leadframe parts and/or between neighboring connecting webs. The electrical connections comprise, for example, electrically conductive strips, electrically conductive bridges or, particularly preferably, bonding wires. The electrical connections are different from the leadframe assemblage and are not produced in one piece therewith. The electrical connections are preferably designed to span connecting webs, wherein the electrical connections are insulated electrically from the connecting webs to be spanned. In particular, the electrical connections are not made from the same material as the leadframe assemblage.

According to at least one embodiment of the method, the latter includes the step of creating a potting body for package bodies of the individual semiconductor components. In particular, the potting body is produced by injection molding, transfer molding, casting or pressing. It is also possible to create the potting body, for example, by liquid transfer molding or compression molding.

According to at least one embodiment, the potting body connects the individual leadframe parts of a leadframe together mechanically. If the leadframe assemblage and the potting body are then singulated to produce individual semiconductor components, the leadframe parts are then joined firmly together mechanically via the package body, in particular solely via the package body. In other words, the package body may be the component which mechanically supports, carries and holds together the semiconductor component.

According to at least one embodiment, the method includes the step of removing and/or interrupting at least some of the connecting webs. Removal and/or interruption of the connecting webs preferably proceeds through the removal of material from the leadframe assemblage. Interruption proceeds, for example, by stamping, bending, breaking, tearing, etching, sawing, grinding and/or by radiation with laser ablation or laser cutting. It is possible for all the connecting webs to be interrupted or removed. However, it is preferred that just some of the connecting webs are interrupted or removed.

According to at least one embodiment, the method includes the step of singulating the leadframe assemblage and/or the potting body into semiconductor components. In this respect, it is possible for the singulation just to be pre-singulation, such that a plurality of semiconductor components remain held together mechanically but with predetermined breaking points between semiconductor components. Predetermined breaking points allow semiconductor components to be separated from one another in particular without the use of tools and in a non-destructive manner in terms of function.

In at least one embodiment, the method serves to produce optoelectronic semiconductor components, such as light-emitting diodes, laser diodes, photodiodes or superluminescent diodes. The method includes at least the following steps. A leadframe assemblage has a plurality of leadframes. The leadframes are each provided for one of the semiconductor components and each comprise at least two leadframe parts and the leadframes are connected at least in part electrically together via connecting webs. Additional electrical connections, in particular bonding wires, are attached between neighboring leadframes. A potting body is formed for package bodies of the individual semiconductor components. The potting body connects the leadframes and the leadframe parts mechanically together. At least some of the connecting webs are removed and/or interrupted, and the processed assemblage is singulated into the semiconductor components.

The individual method steps are preferably carried out in the stated sequence. Alternatively, a different sequence is also possible.

According to at least one embodiment, the optoelectronic semiconductor component produced comprises a QFN component, wherein QFN stands for Quad Flat No-Leads. Such components are surface-mountable.

QFN semiconductor components such as QFN-LEDs often use a half-etched leadframe or leadframe assemblage. In the leadframe assemblage the leadframes for the semiconductor components are connected electrically conductively with their respective neighbors via connecting webs. Once optoelectronic semiconductor chips such as light-emitting diode chips have been mounted on the individual leadframes and electrically contacted, they are then short-circuited. A function test or interconnection of the components prior to singulation is therefore not possible.

Because neighboring leadframes and/or leadframe parts are connected together electrically by connecting webs, separate connections are used and the connecting webs are then at least in part interrupted or removed, neighboring leadframes for the individual semiconductor components can be electrically insulated from one another and thus can also be measured electrically independently of one another, in particular from the back. A matrix circuit in the form of individual rows and columns may in particular be produced.

Through such a leadframe assemblage and such a production method, the components to be produced may be electrically contacted even prior to singulation and the leadframe assemblage can be electrically and thus also optically characterized as a whole. Since testing and characterization proceed in the leadframe assemblage, handling of the individual components is not necessary. Likewise, a function test testing protection diodes against damage from electrostatic discharges is possible even prior to singulation. The brightness of the individual semiconductor components and their color location can also be measured as early as in the leadframe assemblage. In this way, a color location of the emitted radiation can be subsequently corrected and/or modified in the leadframe assemblage or indeed after singulation. Thermography, in particular for controlling the step of attaching the light-emitting diode chips, is also possible, without needle contacting of individual light-emitting diode chips.

According to at least one embodiment of the method, the step of creating the potting body proceeds after the step of attaching the electrical connections. In particular, the electrical connections are embedded in a material of the potting body. After the step of creating the potting body, the electrical connections are then preferably no longer freely accessible.

According to at least one embodiment of the method, the step of removing and/or interrupting at least some of the connecting webs proceeds after creation of the potting body. It is thus possible for the connecting webs to be interrupted only after the leadframe assemblage has been mechanically stabilized by the potting body.

According to at least one embodiment of the method, some of the electrical connections or all the electrical connections are in each case partially or completely removed on singulation into the semiconductor components. If singulation proceeds for instance by sawing, at least some of the electrical connections are sawn through or the electrical connections are wholly located in a saw line and are completely removed.

According to at least one embodiment, the method comprises the step of attaching protection diodes against damage by electrostatic discharges, or ESD protection diodes for short. This step is preferably performed before the potting body is created. On creating the potting body, the protection diodes are preferably covered by the potting body and/or embedded in a material of the potting body. In particular, the protection diodes are no longer freely accessible once the potting body has been created.

According to at least one embodiment, the method comprises the step of attaching optoelectronic semiconductor chips such as light-emitting diode chips in each case to one of the leadframe parts or in each case to a plurality of the leadframe parts of one of the leadframes. The semiconductor chips are, for example, adhesively bonded or soldered to a first one of the leadframe parts and then in particular connected electrically with a second one of the leadframe parts by means of a bonding wire. Alternatively, the semiconductor chips may be "flip chips". Electrical connection of the two leadframe parts then preferably proceeds via the semiconductor chips themselves.

According to at least one embodiment of the method, the step of attaching the semiconductor chips proceeds after creation of the potting body and prior to singulation into the semiconductor components. In particular, the semiconductor chips are mounted in preferably frustoconical or frustopyramidal recesses in the potting body.

According to at least one embodiment of the method, after the step of removing or interrupting at least some of the connecting webs, the leadframe parts within a leadframe are no longer in direct electrical contact with one another. This may mean that no one-piece, electrically conductive material connection exists between the individual leadframe parts. The leadframe parts within the leadframes are, for example, each connected indirectly together electrically only via electrical components such as the optoelectronic semiconductor chips. At least one pn-junction is in particular arranged in a current flow direction between the leadframe parts within a leadframe.

According to at least one embodiment of the method, first ones of the leadframe parts are interconnected electrically to form columns and second ones of the leadframe parts are interconnected electrically to form rows. The optoelectronic semiconductor chips are, for example, each attached to the first leadframe parts. The protection diodes may be attached to the second leadframe parts. Each of the leadframes is preferably associated in a one-to-one relationship with precisely one of the columns and precisely one of the rows. Neighboring rows are preferably insulated electrically from one another, as are neighboring columns. By contacting one of the rows and one of the columns, a semiconductor chip is then electrically operable at a point of intersection between this row and this column.

According to at least one embodiment of the method, first ones of the connecting webs are each located between two neighboring first leadframe parts and along the columns. If the semiconductor chips are not flip chips, the semiconductor chips are attached to the first leadframe parts. The first connecting webs preferably extend from the respective leadframes parallel to a connecting line between the leadframe parts.

According to at least one embodiment of the method, the first connecting webs are removed in part or completely on singulation into the semiconductor components. The first connecting webs lie, for example, completely or in part in a saw line on singulation.

According to at least one embodiment of the method, the first connecting webs are connected conductively together along the columns via the electrical connections. It is thus then possible for the first connecting webs and at least some of the electrical connections to succeed one another alternately along the columns and to be connected electrically in series.

According to at least one embodiment of the method, the method includes the step of testing the as yet unsingulated semiconductor components. Testing involves in particular verifying the functional soundness of the protection diodes and/or the light-emitting diode chips. In this case, current is applied to the light-emitting diode chips or the protection diodes individually and mutually independently preferably row by row and column by column. The testing may comprise four-terminal sensing. In this case, a test contact is preferably located both at the start and the end of each of the columns and rows.

According to at least one embodiment of the method, those ones of the connecting webs which are not affected by the step of removing or interrupting some of the connecting webs come into contact with a material of the potting body on a bottom of the leadframe assemblage remote from the electrical connections. In other words, these connecting webs that have not been removed or interrupted are set back from the bottom of the leadframe assemblage. The bottom is that side which is provided for mounting the singulated semiconductor components. It is possible, in particular, for the uninterrupted, non-removed connecting webs to be surrounded by the material of the potting body in a plane perpendicular to the bottom.

According to at least one embodiment of the method, at least the connecting webs which are affected by removal or interruption have a smaller average thickness than the leadframe parts. For example, the average thickness of these connecting webs is between 20% and 80% inclusive of the thickness of the leadframe parts.

According to at least one embodiment of the method, the connecting webs affected by the removal or interruption terminate flush with the bottom of the leadframe parts. The regions of the bottom which are formed by the leadframe parts and by these connecting webs are preferably in a common plane.

According to at least one embodiment of the method, the leadframe assemblage is etched from two major sides. The major sides are formed in particular by the bottom and by a top opposite the bottom. Etching preferably takes place before the step of attaching the electrical connections and before the step of creating the potting body and before the step of removing or interrupting the connecting webs. Possible further etching from the bottom may remove or interrupt at least some of the connecting webs.

According to at least one embodiment of the method, etching proceeds from the bottom after creating the potting body. Etching from the bottom preferably takes place before attaching the optoelectronic semiconductor chips such as the light-emitting diode chips.

A leadframe assemblage is also provided. The leadframe assemblage is used in a method as mentioned in conjunction with at least one of the above-stated embodiments. Features of the leadframe assemblage are therefore also disclosed for the method and vice versa.

In at least one embodiment, the leadframe assemblage comprises a plurality of individual leadframes. The leadframe assemblage is formed in one piece and the leadframes are arranged in a matrix in the leadframe assemblage. Each of the leadframes is provided for one semiconductor component. The leadframes each comprise at least one first leadframe part and at least one second leadframe part. At least the first leadframe parts are provided such that one optoelectronic semiconductor chip, such as a light-emitting diode chip, is mounted thereon. The individual leadframes and/or leadframe parts are connected at least in part electrically together via connecting webs. First connecting webs are located between neighboring first leadframe parts. The first connecting webs are preferably each arranged parallel to a connecting line between the first and second leadframe parts of the leadframes. The connecting webs are not leadframe parts.

An optoelectronic semiconductor component is also provided, which is produced, using a method as described in conjunction with one or more of the above-stated embodiments, from a stated leadframe assemblage. Features of the method and of the leadframe assemblage are also disclosed for the semiconductor component and vice versa.

In at least one embodiment, the semiconductor component comprises a leadframe with at least one first and with at least one second leadframe part. The semiconductor component likewise includes one or more optoelectronic semiconductor chips such as light-emitting diode chips. The semiconductor chip is fastened mechanically at least to the first leadframe. A package body connects the leadframe parts together mechanically and comprises a recess in which the semiconductor chip is mounted. The semiconductor component comprises at least one electrical connection in the form of a bonding wire. The electrical connection is at most in indirect electrical contact with the semiconductor chip. In particular, the semiconductor chip and the electrical connection are not in direct contact with one another and do not touch one another.

According to at least one embodiment of the semiconductor component, the latter comprises a mounting side which is provided for mounting the semiconductor component. The leadframe parts are accessible for mounting only on the mounting side. In particular, the semiconductor components project out of the package body only on the mounting side or terminate flush with the package body only on the mounting side.

According to at least one embodiment of the semiconductor component, the electrical connection is freely accessible on one or on a plurality of particularly opposing side faces of the package body. Preferably, a material of the electrical connection is exposed on at least one side face and is not covered by a material of the package body.

According to at least one embodiment, the exposed electrical connection is surrounded by a material of the package body when viewed in plan view onto the side face. In other words, the electrical connection is not located at an edge but rather within the side face.

A method described here together with a leadframe assemblage described here and a semiconductor component described here will be explained in greater detail below with reference to the drawings and with the aid of exemplary embodiments. Elements which are the same in the individual figures are indicated with the same reference numerals. The relationships between the elements are not shown to scale, but rather individual elements may be shown exaggeratedly large to assist in understanding.

BRIEF DESCRIPTION OF THE DRAWINGS

In the drawings:

FIGS. 1A to 5 and 7A to 9B are schematic representations of exemplary embodiments of methods for producing optoelectronic semiconductor components described here with leadframe assemblages described here;

DETAILED DESCRIPTION OF ILLUSTRATIVE EMBODIMENTS

Figure 1A:
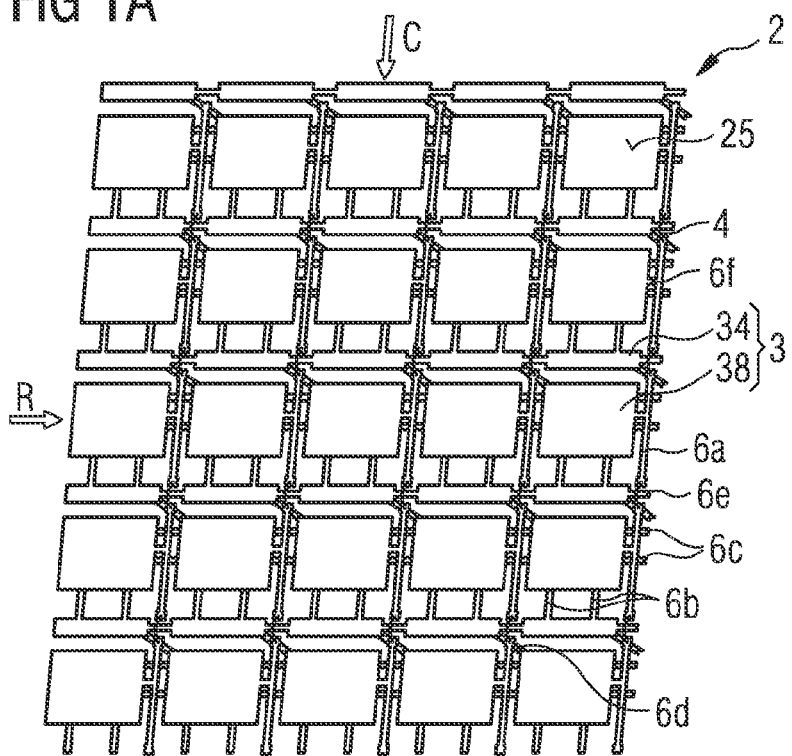
Figure 1B:
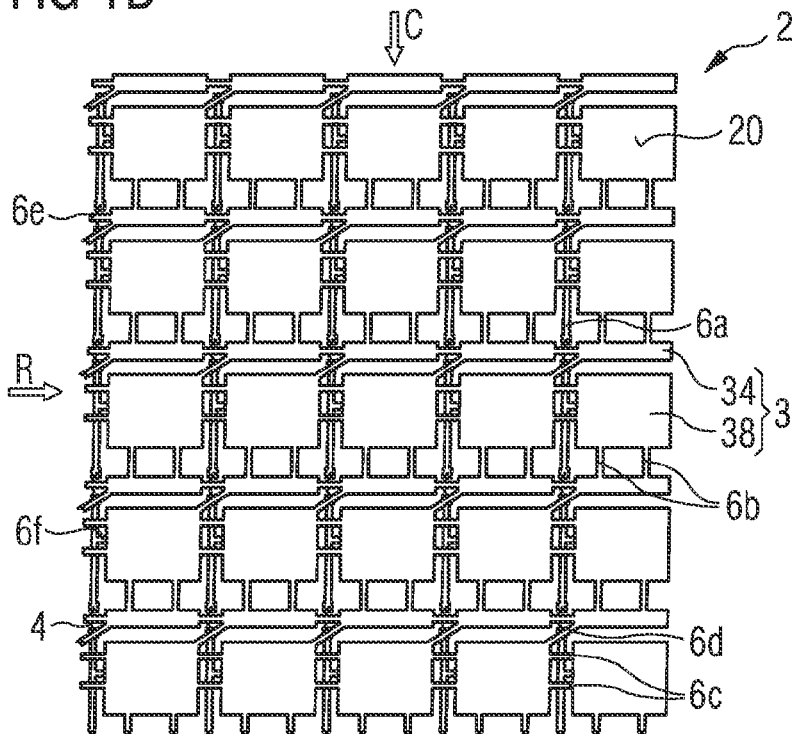

FIGS. 1 to 5 show a production method for an optoelectronic semiconductor component 1. FIG. 1 shows a first method step, according to which a leadframe assemblage 2 is provided with a plurality of leadframes 3, see the perspective plan view in FIG. 1A, the perspective view from below in FIG. 1B and the enlarged portion of FIG. 1A according to FIG. 1C.

The individual leadframes 3 each comprise a first leadframe part 38 and a second leadframe 34 part. The larger first leadframe part 38 is provided such that an optoelectronic semiconductor chip such as a light-emitting diode chip is fastened mechanically thereto and electrically contacted.

The leadframe assemblage 2 further comprises connecting webs 6a, 6b, 6c, 6d, 6e, 6f. Like the leadframe parts 34, 38, the connecting webs are formed in one piece and made from the same raw material. The connecting webs 6 are different from the leadframe parts 34, 38. In the finished semiconductor component, the connecting webs no longer carry out any mechanical or electrical function.

The individual leadframes 3 are arranged in the leadframe assemblage 2 regularly in the manner of a matrix in rows R and in columns C oriented perpendicular thereto. In the columns C neighboring leadframes 3 are connected together via two connecting webs 6b. The first leadframe parts 38 of neighboring leadframes 3 are connected together along the rows R via the connecting webs 6c, 6f, and the second leadframe parts 34 via the connecting webs 6e. The leadframe assemblage 2 optionally comprises connecting webs 6d, which connect together the leadframe parts 34, 38 of neighboring leadframes 3 in a diagonal direction. The connecting webs 6a, which extend along the columns C, are located between the first leadframe parts 38 of neighboring leadframes 3.

In addition to the step of providing the leadframe assemblage 2, FIG. 1 shows a further step of the method, according to which additional electrical connections 4 are attached between neighboring leadframes 3 and connecting webs 6a. The electrical connections 4 are formed by bonding wires. Along the columns C the electrical connections 4 connect neighboring and spaced connecting webs 6a.

It is optionally possible for the connecting webs and the leadframe parts 34, 38 to comprise mutually different average thicknesses. In particular, the connecting webs may have a smaller average thickness than the leadframe parts 34, 38. For example, the connecting webs 6a, 6e, 6f extend flush with the leadframe parts 34, 38 on a top 25 of the leadframe 2, see in particular FIGS. 1A and 1C, while the leadframe parts 6b, 6c, 6d extend flush with a bottom 20 of the leadframe parts 34, 38. Unlike in FIG. 1, it is possible for all the connecting webs to have the same thickness and to extend flush with both the top 25 and the bottom 20.

The leadframe assemblage 2 is, for example, formed from a copper sheet or a sheet of a copper alloy. The leadframe assemblage 2 has lateral dimensions of roughly 70 mm×250 mm, for example. The leadframe assemblage 2 may be coated on the top 25 and/or on the bottom 20 in part or over the entire surface with nickel, palladium, gold and/or silver, also in multiple layers. The thickness of the leadframe assemblage 2, perpendicular to the top 25, is preferably between 150 µm and 400 µm inclusive, in particular roughly 200 µm. The average thickness of the connecting webs preferably amounts to 30% and 70% inclusive of the average thickness of the leadframe parts 34, 38.

As also in all the other exemplary embodiments, an average period length and/or the average lateral dimensions of the individual leadframes 3 are, for example, between 1 mm and 6 mm inclusive, in particular roughly 2.5 mm. An average width of the individual connecting webs amounts, for example, to roughly 100 µm. The electrical connections 4 may be gold bonding wires with an average diameter in the range of a few tens of micrometers.

FIGS. 2A to 2C show a further method step, according to which a potting body 50 is mounted for package bodies 5 of the individual semiconductor components 1. The potting body 50 is produced in particular by transfer molding. The potting body 50 preferably extends above the top 25 and terminates flush with the bottom 20. The individual leadframe parts 34, 38 are connected together mechanically via the potting body 50, see FIG. 2A.

Merely for better illustration, FIG. 2B shows in a perspective representation one of the package bodies 5 and a light-emitting diode chip 8 with an electrical contact line 9 in the form of a bonding wire in a recess 58 in the package body 5. Likewise merely for better illustration, an individual one of the package bodies 5 is illustrated in plan view in FIG. 2C.

Figure 3A:
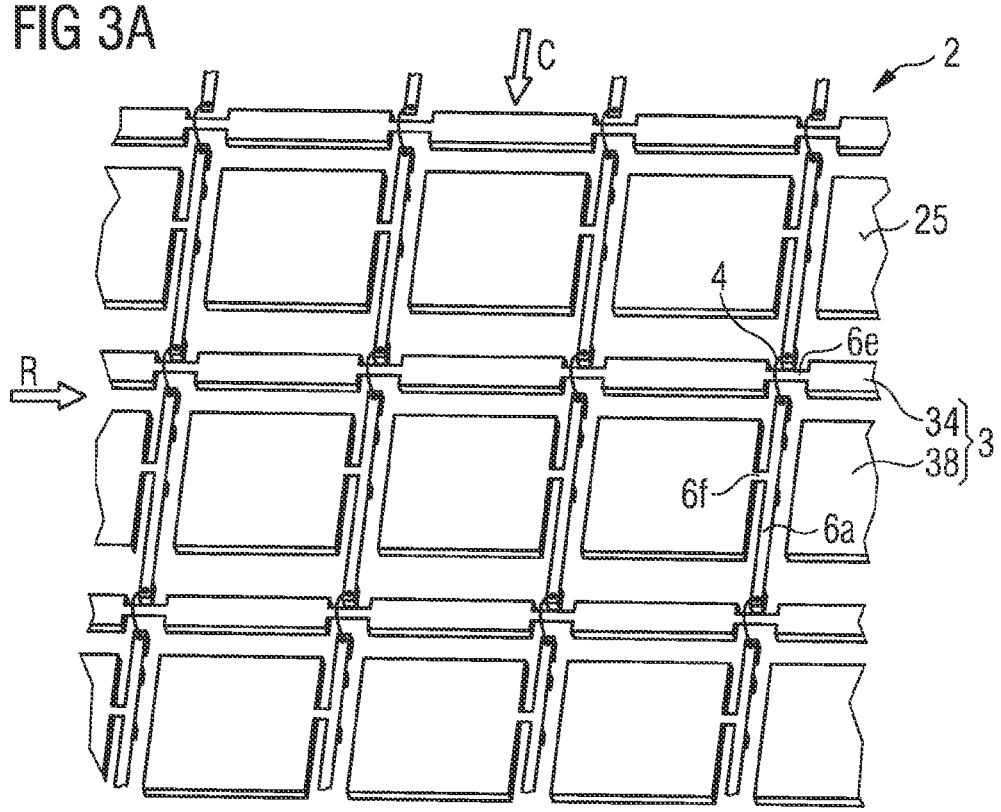
Figure 3B:
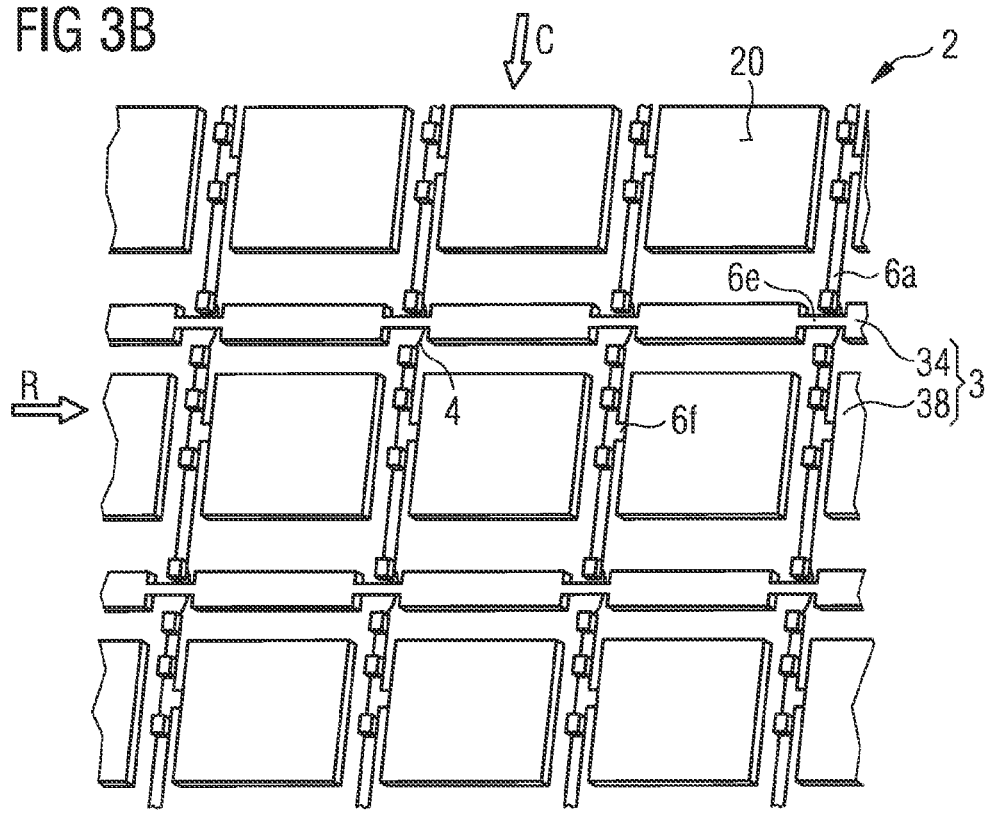
Figure 3C:
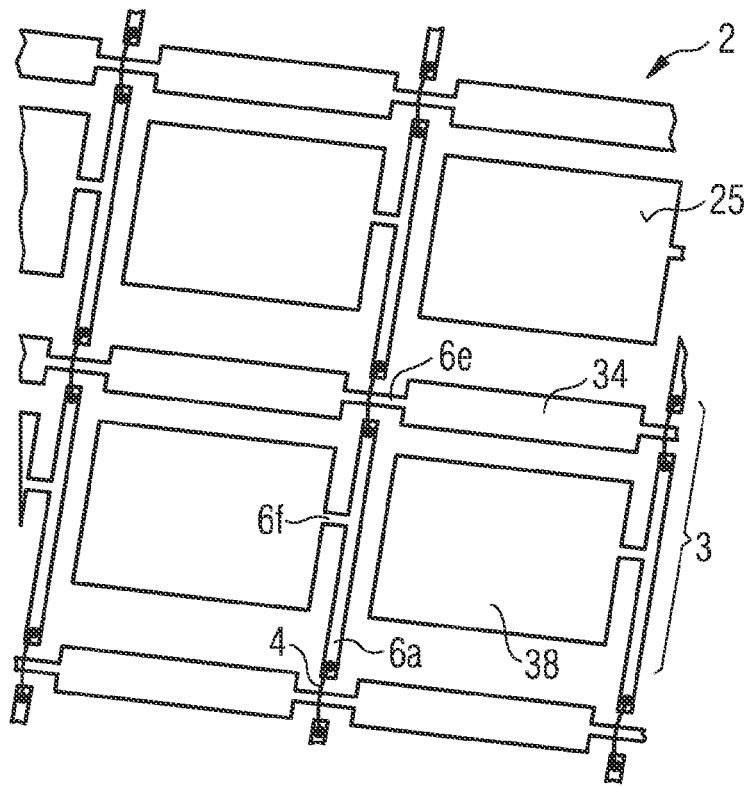

FIG. 3 shows a further method step, the removal and interruption of at least some of the connecting webs, in a perspective plan view in FIG. 3A, in a perspective view from below in FIG. 3B and in a detail of FIG. 3A in FIG. 3C.

To simplify the representation, the completed potting body 50 is not shown in FIG. 3. FIG. 3 shows that only the connecting webs 6a, 6e, 6f remain. The connecting webs 6b, 6c, 6d, see, e.g., FIG. 1, have been removed. By removing the connecting webs 6b, 6c, 6d and through prior attachment of the electrical connections 4, the leadframe parts 38 are connected electrically along the columns C and the leadframe parts 34 along the rows R. Neighboring rows R and neighboring columns C are each insulated electrically from one another.

Figure 4:
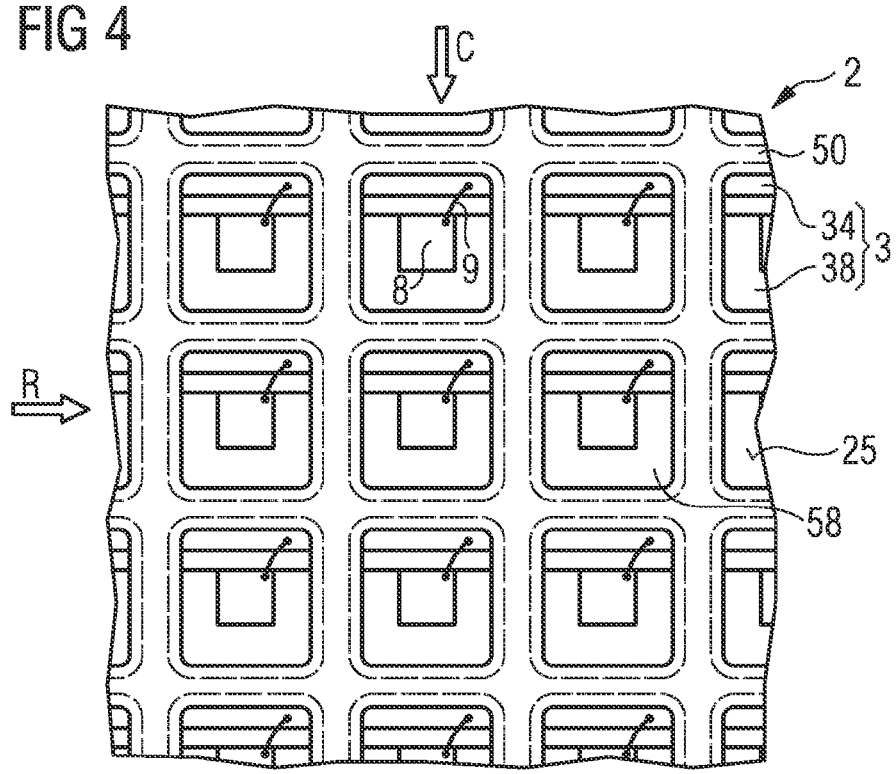

In a further method step, see, e.g., the plan view according to FIG. 4, the light-emitting diode chips 8 are mounted on the tops 25 of the first leadframe parts 38. The light-emitting diode chips 8 are connected electrically via bonding wires 9 with the second leadframe parts 34.

Since the rows R and columns C can be driven electrically independently of one another, the individual light-emitting diode chips 8 may be electrically operated mutually independently at intersection points and thus tested electrically, thermally and optically, before singulation into individual semiconductor components 1 is performed.

Figure 5:
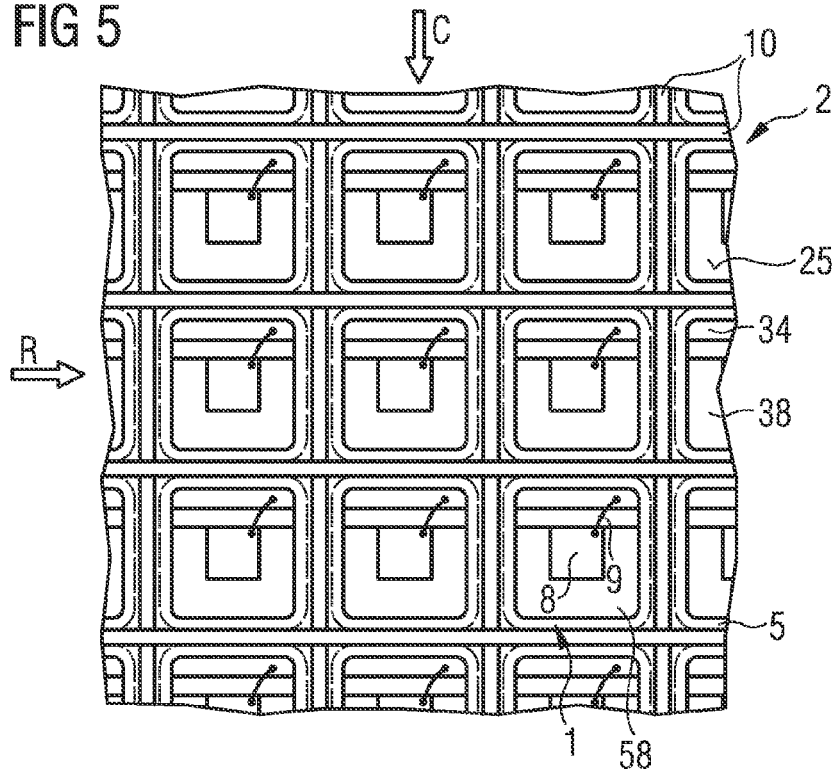

Singulation into semiconductor components 1 is illustrated in plan view in FIG. 5. Neighboring semiconductor components 1 are separated from one another, for example, by sawing, along straight singulation regions 10 between neighboring leadframes 3.

Figure 6A:
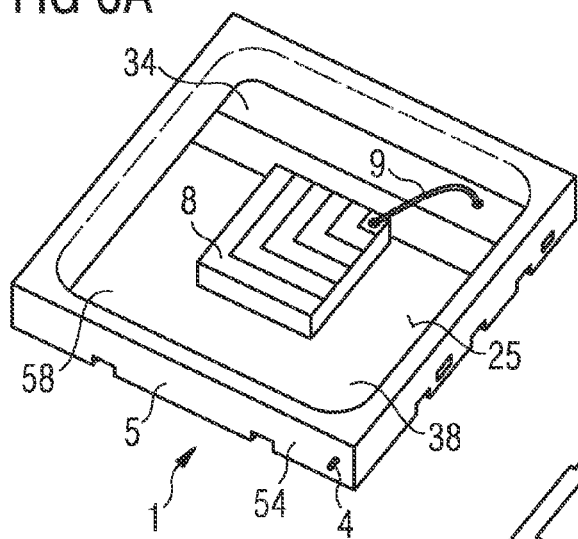
FIGS. 6A to 6B are schematic representations of an exemplary embodiment of an optoelectronic semiconductor component described here.
Figure 6B:
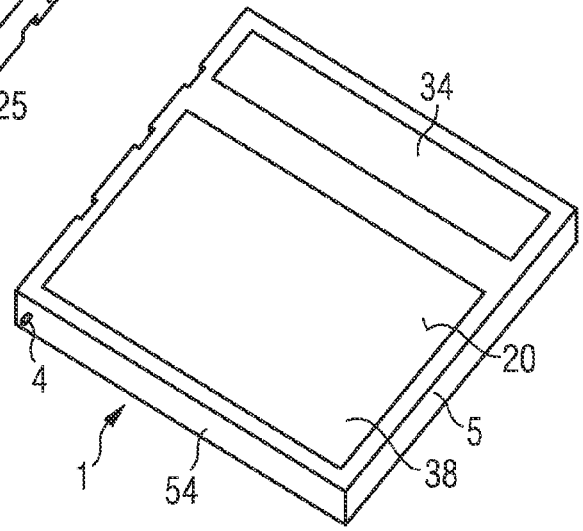

The resultant semiconductor components 1 are shown in a perspective plan view in FIG. 6A and in a perspective view from below in FIG. 6B. The leadframe parts 34, 38 are each surrounded by a material of the package body 5. The semiconductor component 1 is surface-mountable with the bottom 20.

The light-emitting diode chip 8 is preferably located centrally in the recess 58. Unlike in the illustration, side walls of the recess 58 may be covered with a reflective material and/or with a material of the leadframe parts 34, 38.

The electrical connections 4 are exposed on one side face 54 of the package body 5 and is surrounded by a material of the package body 5, looking in plan view onto the side face 54. The electrical connections 4 are preferably a remnant of the interconnection to columns C and rows R during testing. In the finished semiconductor components 1 the electrical connections 4 no longer perform any electrical or mechanical function.

A plurality of notches, which extend to the side face 54, are visible on the bottom 20 of the semiconductor component 1. These notches are cavities which were filled in before removal of the connecting webs 6b, 6c, 6d.

A further embodiment of the method is shown in schematic sectional representations in FIG. 7 along one of columns C. The leadframe assemblage 2 is provided according to FIG. 7A. The leadframe assemblage is etched in places from the top 25, so resulting in particular in the connecting webs 6b, see, e.g., also FIG. 1. It is optionally possible for the leadframe also to have been etched from the bottom 20, in particular in order to separate the leadframe parts 34, 38 from one another within a leadframe 3.

The potting body 50 is created according to FIG. 7B. The leadframe parts 34, 38 and neighboring leadframes 3 are connected together mechanically via the potting body 50. At variance with the illustration in FIG. 7B, it is possible for a thickness of the potting body 50 between the leadframe parts 34, 38 within a leadframe 3 to correspond to the thickness of the leadframe parts 34, 38.

FIG. 7C shows that the leadframe assemblage 2 is etched from the bottom 20. In this way, in particular the connecting webs 6B are removed. This makes it possible for the leadframe parts 34, 38 to project out of the potting body 50 at the bottom 20. In other words, the leadframe parts 34, 38 are then raised relative to the potting body 50.

FIG. 7D shows mounting of the light-emitting diode chips 8 and contacting of the light-emitting diode chips 8 via the bonding wires 9. A wavelength conversion element 82 is optionally mounted on each of the light-emitting diode chips 8. Radiation generated by the light-emitting diode chips 8 may be partially or completely converted via the wavelength conversion element 82 into radiation of another wavelength.

The recess 58 is optionally partially or completely filled with a filling 85. Optical properties of the semiconductor component 1 may be adjusted via the filling 85. The filling 85 comprises scattering particles, for example. Unlike in the illustration, the filling 85 may also be lenticular in shape, for example, in the form of a convergent lens, a Fresnel lens or in the form of microlenses. The filling 85 may also be roughened for light outcoupling purposes. Such wavelength conversion elements 82 and/or fillings 85 may also be present in all the other exemplary embodiments.

The singulation regions 10 are located between neighboring semiconductor components 1. Singulation proceeds, for example, by sawing.

The sectional representations according to FIG. 8A and FIG. 8B, taken along one of rows R, show further exemplary embodiments of the leadframe assemblage 2 and the semiconductor components 1. According to FIG. 8A, a testing tool 90 is mounted on the bottom 20 on the second leadframe part 34 at the end of row R. The testing tool 90 may be a needle or a "Pogo pin". Unlike in the illustration, it is possible for one of the test tools 90 to be located both at the start and at the end of the row R. By way of the individual rows and also the columns, not shown, the light-emitting diode chips 8 can mutually independently have current applied to them and thus be tested.

In the exemplary embodiment according to FIG. 8B, a test contact 29 is formed laterally next to the semiconductor components 1. This makes it possible for the test tool 90 on the top 25 to contact the test contact 29. It is possible for such testing to take place via the test tools 90 from the bottom 20 or the top 25 in all the other exemplary embodiments of the method too.

Figure 9A:
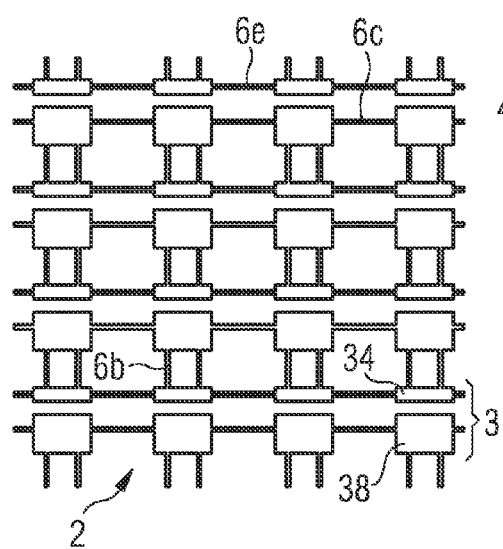
Figure 9B:
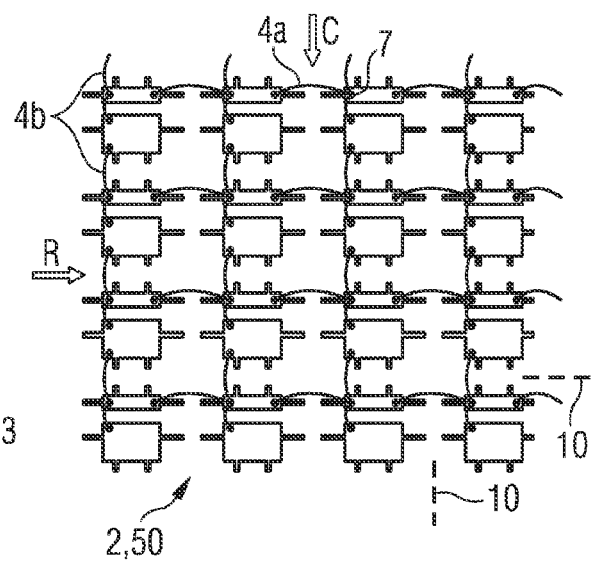

A further embodiment of the method, with a further exemplary embodiment of the leadframe 2, is shown in schematic plan views in FIGS. 9A and 9B. The leadframe assemblage 2 is provided according to FIG. 9A.

Neighboring leadframes 3 are connected together via the connecting webs 6b, 6c, 6e.

FIG. 9B shows the leadframe assemblage 2, wherein the connecting webs 6e and 6c and the connecting webs 6b are each interrupted and the leadframe assemblage 2 is mechanically stabilized by the potting body 50, not shown. The electrical connections 4a provide an electrically continuous connection along the rows R and via the electrical connections 4b along the columns C.

A protection diode 7 providing protection against damage caused by electrostatic discharges is optionally mounted on each of the leadframe parts 34. The electrical connections 4b are in particular connected only indirectly with the leadframe part 34 and preferably attached to a top of the protection diode 7 remote from the leadframe part 34.

Figure 10A:
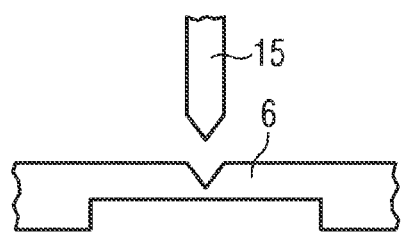
FIGS. 10A to 10B are schematic representations of the method step of interrupting a leadframe assemblage described here.
Figure 10B:

FIGS. 10A and 10B show schematic side views of interruption of the connecting webs 6 by bending. Other parts of the leadframe assemblage 3 may also be separated from one another in this way, as also in all the other exemplary embodiments. Interruption of the connecting webs 6 may thus also proceed without or without significant removal of material.

According to FIG. 10A, a singulating tool 15 in the form of a chisel or a cutting edge may be applied to the connecting web 6. The connecting web 6 may here optionally already be pre-notched and/or be thinner than adjoining sub-regions of the leadframe assemblage 3. The connecting web 6 is then bent and severed using the singulating tool 15. The bent, torn and mutually separated regions remain on the connecting web 6, see FIG. 10B. These regions enable the achievement of an improved connection with the potting body 50.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing optoelectronic semiconductor components, the method comprising:
   providing a leadframe assemblage with a plurality of leadframes, wherein the leadframes are each provided for one of the semiconductor components and each comprise at least two leadframe parts, and wherein the leadframes are connected together at least in part via connecting webs;
   attaching additional electrical connections between neighboring leadframes;
   forming a potting body for package bodies of individual semiconductor components, wherein the potting body connects the leadframes and the leadframe parts mechanically together;
   removing and/or interrupting at least some of the connecting webs; and
   singulating a resulting structure into the semiconductor components,
   wherein remaining connecting webs remain after removing at least some of the connecting webs, the remaining connecting webs being in contact with a material of the potting body on a bottom of the leadframe assemblage remote from the additional electrical connections and, in a plane perpendicular to the bottom, are surrounded by the material of the potting body.

2. The method according to claim 1, wherein after removing at least some of the connecting webs, the leadframe parts within the respective leadframe are not in direct electrical contact with one another, wherein first ones of the leadframe parts are interconnected electrically to form columns and second ones of the leadframe parts are interconnected electrically to form rows, and wherein neighboring rows and neighboring columns are insulated electrically from one another.

3. The method according to claim 2, wherein first ones of the connecting webs are located between two neighboring first leadframe parts and along the columns, and wherein the first connecting webs are removed in part or completely while singulating the resulting structure.

4. The method according to claim 1, wherein forming the potting body is performed after attaching the additional electrical connections and before removing at least some of the connecting webs.

5. The method according to claim 1, wherein those connecting webs that are removed while removing the at least some of the connecting webs have a smaller average thickness than the leadframe parts and terminate flush with the leadframe parts on the bottom of the leadframe assemblage remote from the additional electrical connections.

6. The method according to claim 1, wherein the additional electrical connections comprise bonding wires, and wherein the additional electrical connections are removed in part or completely during singulating.

7. The method according to claim 1, further comprising mounting protection diodes, before forming the potting body so that the protection diodes are subsequently covered by the potting body.

8. The method according to claim 7, further comprising electrically testing the protection diodes before singulating the resulting structure, wherein electrically testing includes applying current to the protection diodes row-by-row and column-by-column.

9. The method according to claim 1, further comprising mounting light-emitting diode chips, each light-emitting diode being mounted on one of the leadframe parts or on two of the leadframe parts of one of the leadframes, wherein the light-emitting diode chips are mounted after creating the potting body and before singulating the resulting structure.

10. The method according to claim 9, further comprising electrically testing the light-emitting diodes before singulating the resulting structure, wherein electrically testing includes applying current to the light-emitting diodes row-by-row and column-by-column.

11. The method according to claim 1, wherein the leadframe assemblage is etched from two major sides.

12. The method according to claim 11, wherein etching proceeds from the bottom both before and after forming the potting body, and wherein etching from a top opposite the bottom only proceeds before attaching the additional electrical connections.

13. A method for producing optoelectronic semiconductor components, the method comprising:
 providing a leadframe assemblage with a plurality of leadframes, wherein the leadframes are each provided for one of the semiconductor components and each comprise at least two leadframe parts, and wherein the leadframes are connected together at least in part via connecting webs;
 attaching additional electrical connections between neighboring leadframes;
 forming a potting body for package bodies of individual semiconductor components, wherein the potting body connects the leadframes and the leadframe parts mechanically together;
 removing and/or interrupting at least some of the connecting webs; and
 singulating a resulting structure into the semiconductor components,
 wherein after removing at least some of the connecting webs, the leadframe parts within the respective leadframe are not in direct electrical contact with one another,
 wherein first ones of the leadframe parts are interconnected electrically to form columns and second ones of the leadframe parts are interconnected electrically to form rows, and
 wherein neighboring rows and neighboring columns are insulated electrically from one another.

14. The method according to claim 13, wherein first ones of the connecting webs are located between two neighboring first leadframe parts and along the columns, wherein the first connecting webs are removed in part or completely while singulating the resulting structure.

15. A method for producing optoelectronic semiconductor components, the method comprising:
 providing a leadframe assemblage with a plurality of leadframes, wherein the leadframes are each provided for one of the semiconductor components and each comprise at least two leadframe parts, and wherein the leadframes are connected together at least in part via connecting webs;
 attaching additional electrical connections between neighboring leadframes;
 forming a potting body for package bodies of individual semiconductor components, wherein the potting body connects the leadframes and the leadframe parts mechanically together;
 removing and/or interrupting at least some of the connecting webs;
 singulating a resulting structure into the semiconductor components;
 mounting protection diodes before forming the potting body so that the protection diodes are subsequently covered by the potting body; and
 electrically testing the protection diodes before singulating the resulting structure, wherein electrically testing includes applying current to the protection diodes row-by-row and column-by-column.

16. A method for producing optoelectronic semiconductor components, the method comprising:
 providing a leadframe assemblage with a plurality of leadframes, wherein the leadframes are each provided for one of the semiconductor components and each comprise at least two leadframe parts, and wherein the leadframes are connected together at least in part via connecting webs;
 attaching additional electrical connections between neighboring leadframes;
 forming a potting body for package bodies of individual semiconductor components, wherein the potting body connects the leadframes and the leadframe parts mechanically together;
 removing and/or interrupting at least some of the connecting webs;
 singulating a resulting structure into the semiconductor components;
 mounting light-emitting diode chips, each light-emitting diode being mounted on one of the leadframe parts or on two of the leadframe parts of one of the leadframes, wherein the light-emitting diode chips are mounted after forming the potting body and before singulating the resulting structure; and
 electrically testing the light-emitting diodes before singulating the resulting structure, wherein electrically testing includes applying current to the light-emitting diodes row-by-row and column-by-column.

\* \* \* \* \*